(12) United States Patent
Liao

(10) Patent No.: US 9,161,464 B2
(45) Date of Patent: Oct. 13, 2015

(54) WALL ADAPTOR

(71) Applicant: Sheng-Hsin Liao, New Taipei (TW)

(72) Inventor: Sheng-Hsin Liao, New Taipei (TW)

( * ) Notice: Subject to any disclaimer, the term of this patent is extended or adjusted under 35 U.S.C. 154(b) by 14 days.

(21) Appl. No.: 14/176,459

(22) Filed: Feb. 10, 2014

(65) Prior Publication Data

US 2015/0146348 A1 May 28, 2015

(30) Foreign Application Priority Data

Nov. 22, 2013 (TW) .............................. 102142645 A
Jan. 14, 2014 (TW) .............................. 103101255 A

(51) Int. Cl.
*H01R 13/60* (2006.01)
*H05K 5/00* (2006.01)

(52) U.S. Cl.
CPC .................................. *H05K 5/0065* (2013.01)

(58) Field of Classification Search
CPC .... H01R 13/74; H01R 2103/00; H01R 13/60; H01R 13/6675; H01R 24/78
USPC ......................................... 439/652, 535, 638
See application file for complete search history.

(56) References Cited

U.S. PATENT DOCUMENTS

| | | | | |
|---|---|---|---|---|
| 5,738,548 | A | * | 4/1998 | Rutulante ...................... 439/652 |
| 6,050,849 | A | * | 4/2000 | Chang ........................... 439/536 |
| 6,861,822 | B2 | * | 3/2005 | Wei ................................ 320/111 |
| 6,955,559 | B2 | * | 10/2005 | Pyrros .......................... 439/535 |
| 7,140,922 | B2 | * | 11/2006 | Luu et al. ..................... 439/651 |
| 8,043,116 | B2 | | 10/2011 | Liao |
| 8,221,158 | B2 | | 7/2012 | Liao |
| 8,415,920 | B2 | | 4/2013 | Liao |
| 8,469,748 | B2 | * | 6/2013 | Chambers ..................... 439/638 |
| 2003/0176101 | A1 | * | 9/2003 | Miller, Jr. ..................... 439/535 |
| 2004/0121648 | A1 | * | 6/2004 | Voros ............................ 439/535 |
| 2008/0157715 | A1 | * | 7/2008 | Rosenboom et al. ......... 320/108 |
| 2011/0084651 | A1 | * | 4/2011 | Caskey et al. ................. 320/107 |
| 2011/0287665 | A1 | * | 11/2011 | Chien ........................... 439/638 |
| 2012/0086437 | A1 | * | 4/2012 | Lin ............................... 324/156 |

* cited by examiner

*Primary Examiner* — Briggitte R Hammond
(74) *Attorney, Agent, or Firm* — Li & Cai Intellectual Property (USA) Office

(57) ABSTRACT

A wall adaptor includes an adaptor body, a terminal unit and a connector module. The terminal unit is disposed on the adaptor body and has a pin arrangement, and the connector module is detachably disposed on the adaptor body. The connector module has a module body and at least a first connector disposed on the adaptor body, the connector module and the adaptor body are in electrical communication through electrical contacts. The connector module is replaceable for broader implementation.

22 Claims, 20 Drawing Sheets

WALL ADAPTOR

BACKGROUND

1. Field of the Invention

The instant disclosure relates to a wall adaptor; in particular, to a wall adaptor fixed on a wall receptacle or the like.

2. Description of Related Art

Conventional utility planning and design for interiors usually involves embedment in the wall and connection to the receptacle on the wall for electricity or signal transmission. When an electronic product (for example, mobile phone, digital camera, personal digital assistance or other portable electronic device) runs low in power and needs supplement electricity to maintain operation, recharge or signal transmission is done by wire connection, a user can connect the electronic product to electricity or signal wiring through a cable with a head plugging into the receptacle so as to obtain power or connect to the Internet.

U.S. Pat. No. 8,415,920 by the present applicant disclosed a charger and a combination structure. One side of the charger is formed with terminals. The charger has a connector. The terminals, the connector and a charging circuit inside the charger are electrically connected. The charger has a panel connecting piece. The charger can be combined with the receptacle panel and provide easy access without difficulty to be found. The charger also functions as an adaptor.

However, the connector of the charger (adaptor) is fixed to the main body of the charger. Therefore, the connector cannot be replaced according to user need, which lacks in adaptability. If a user is going to use another type of connector, a new type of charger has to purchased, which cause extra burden to the user. Furthermore, the charger (adaptor) has limited functions without the service of carrying an electronic product. A different type of receptacle (U.S. Pat. Nos. 8,043,116 and 8,221,158) is provided yet the receptacle does not serve as an adaptor.

To address the above issues, the inventor strives via associated experience and research to present the instant disclosure, which can effectively improve the limitation described above.

BRIEF SUMMARY OF THE INVENTION

The instant disclosure provides a wall adaptor suitable to different types of connector modules and therefore has better adaptability which is more convenient. The adaptor main body needs not to be changed, such that the cost is reduced, and the financial burden on the consumer is relieved.

The wall adaptor also functions to carry an electronic product.

According to one exemplary embodiment of the instant disclosure, the wall adaptor includes an adaptor body formed with an accommodating slot, a terminal unit disposed on the adaptor body and having a pin arrangement, and a connector module detachably disposed in the accommodating slot of the adaptor body. The connector module has a module body and at least a first connector disposed on the adaptor body, the connector module and the adaptor body are in electrical communication through electrical contacts, and the at least one first connector is exposed on the adaptor body.

According to another embodiment of the instant disclosure, the wall adaptor includes an adaptor body, a terminal unit disposed on the adaptor body and a connector module detachably disposed in the accommodating slot of the adaptor body. The connector module has a module body and at least a first connector disposed on the adaptor body, the connector module and the adaptor body are in electrical communication through electrical contacts.

The connector module is detachably disposed on the connector body, such that different connector modules can be used so as to improve the adaptability. In this way, the wall adaptor is more convenient in practical use. The adaptor body does not need to be changed, such that the cost is reduced and the consumer does not need to buy additional adaptors.

The wall adaptor may also include a load plate for carrying an electronic product. The load plate accommodates the electronic product under charge or signal transmission through the wall adaptor, protects the electronic product and maintains practical usage under charge and signal transmission when in operation.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE INVENTION

The aforementioned illustrations and following detailed descriptions are exemplary for the purpose of further explaining the scope of the instant disclosure. Other objectives and advantages related to the instant disclosure will be illustrated in the subsequent descriptions and appended drawings.

[First Embodiment]

Figure 1:
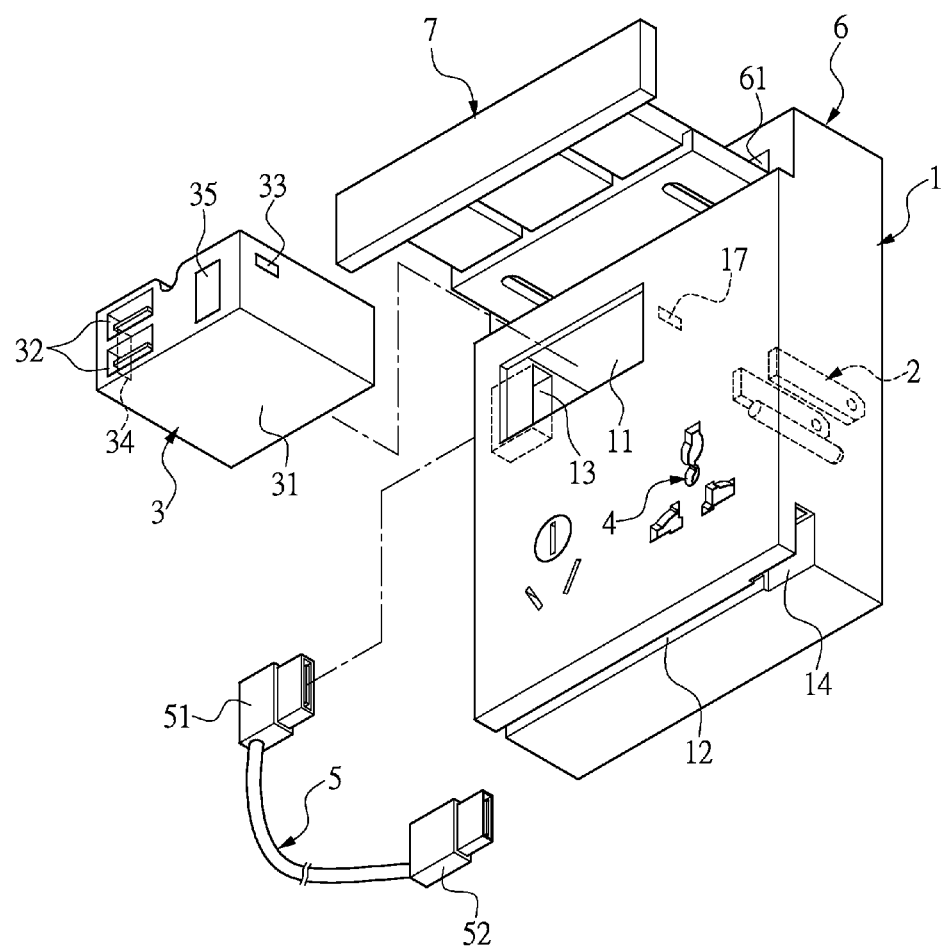
FIG. 1 is a perspective exploded view of a wall adaptor in accordance with a first embodiment of the instant disclosure.
Figure 2:
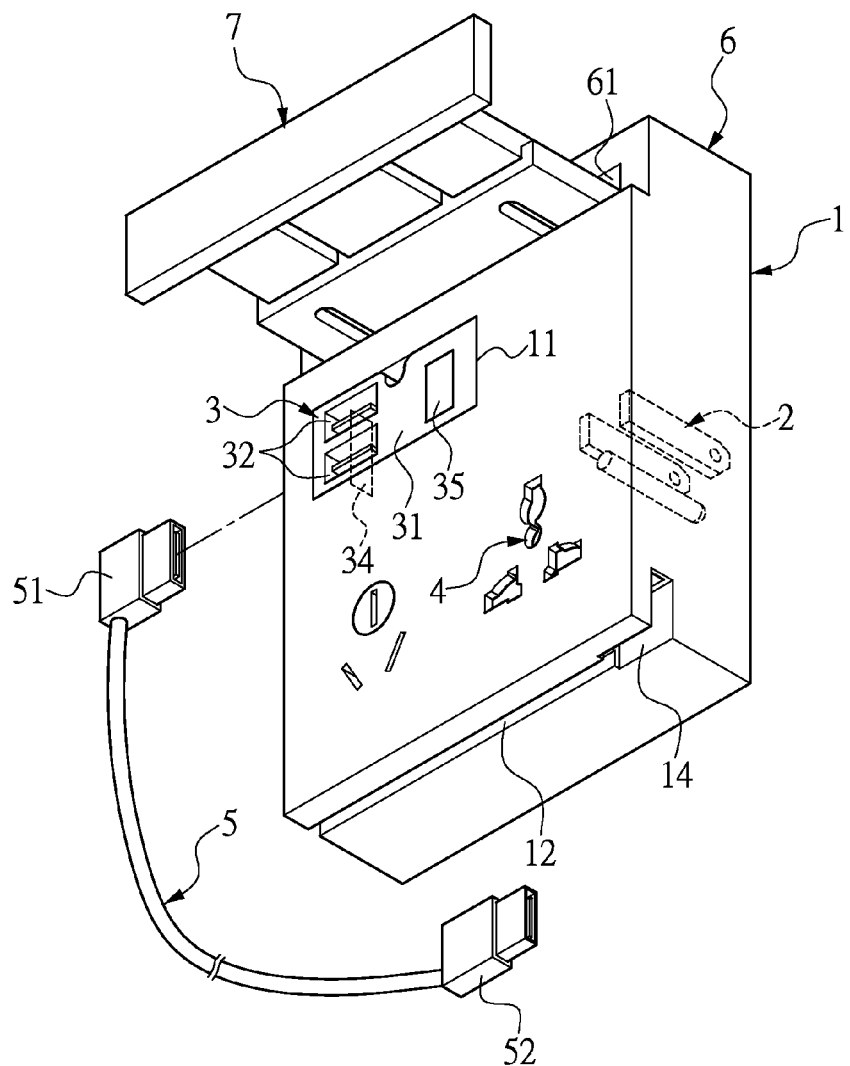
FIG. 2 is a perspective view of a wall adaptor in accordance with a first embodiment of the instant disclosure.

Please refer to FIGS. 1 and 2. The instant disclosure provides a wall adaptor. The wall adaptor can be plugged to a wall receptacle or the like. The interior of the wall adaptor may further have charging circuit (not shown) to serve as a charger. The charging circuit is known to a person skilled in the art, and herein it is not repeated. If charging is not required from the wall adaptor, the charging circuit can be omitted in the instant embodiment.

The wall adaptor includes an adaptor body 1, a terminal unit 2 and at least one connector module 3. The configuration of the adaptor body 1 is not limited to a plate, a block, or any other geometrical configuration, and the adaptor body 1 may have different configurations according to design requirements. The adaptor body 1 may be integrally formed, two-piece or multiple-piece. The adaptor body 1 may also have a receptacle unit 4. The standard and configuration of the receptacle unit 4 are not limited to any types of receptacle or electrical connector. The adaptor body 1 may also have appropriate circuit (not shown).

The terminal unit 2 is disposed on the adaptor body 1. The terminal unit 2 may be pins, yet the configuration and arrangement of the terminal unit 2 are not limited thereto. The terminal unit 2 may be fixedly or retractably disposed on the adaptor body 1. The terminal unit 2 may project out of one side (rear side) of the connector body 1. Preferably, the terminal unit 2 is disposed on one side of the adaptor body 1 where the receptacle unit 4 is not present. In the instant embodiment, the terminal unit 2 and the receptacle unit 4 are arranged at opposite sides (front and rear) of the adaptor body 1.

The connector module 3 is detachably disposed on the adaptor body 1, and the connector module 3 may be electrically connected to the adaptor body 1 and the terminal unit 2. The number of the connector module 3 may be one; however, it can be two or more according to design requirement. In the instant embodiment, the number of the connector module 3 is one. The connector module 3 has a module body 31 and at least one first connector 32 disposed on the module body 31. The module body 31 may be configured to a square or any other geometrical shape, and the instant disclosure is not limited thereto. The first connector 32 may be a USB connector, IEEE1394 connector, HDMI connector, AV terminal, DC terminal or the like. On one side (front side) of the adaptor body 1 is formed with an accommodating slot 11 for receiving the connector module 3. The connector module 3 is detachably (selectively) accommodated in the accommodating slot 11. Alternatively, the connector module 3 may be secured to the adaptor body 1 by screws or tenon. The first connector 32 is exposed on the adaptor body 1.

The edge of the connector module 3 has one, two or more electrical contacts 33 serving as an input to be electrically connected to corresponding electrical contacts 17 on the adaptor body 1. The electrical contacts 17 of the adaptor body 1 are electrically connected to the terminal unit 2, such that the connector module 3, the internal circuit of the adaptor body 1 and the terminal unit 2 are electrically connected. As a result, the power or signal from the adaptor body 1 and the terminal unit 2 can be transmitted to the connector module 3. The connector module 3 and the first connector 32 serve as an output.

In the instant embodiment, the accommodating slot 11 is positioned on one side (front side) of the adaptor body 1, such that the connector module 3 is exposed on the side of the adaptor body 1. In another embodiment (not shown), there are more than one connector module 3, and the thickness of the adaptor body 1 is greater, such that a portion of the accommodating slot 11 is positioned at the edge of the adaptor body 1, and the connector module 3 is exposed on the edge of the adaptor body 1.

The connector module 3 is disposed on the adaptor body 1. The front end of the connector module 3 may be slightly projected out of the front of the adaptor body 1, or the connector module 3 may be coplanar relative to the front of the adaptor body 1. The sides of the connector module 3 may also be formed with depressions or bumps (not shown) so as to allow easy movement with tool when the connector module 3 should be released from the accommodating slot 11. In this way, a user can easily replace the connector module 3.

The module body 31 may further include an electronic device 35. The electronic device may be concealed or exposed on the module body 31. The electronic device 35 may be a convertor, night lamp, wireless charger, emergency light, wireless controller, wireless access point, wireless module, timer, ground fault circuit interrupters (GFCI), cable receiver, sensor or the like. The electronic device 35 may also be a portable detector to detect any movement around. The electronic device 35 may also be a battery, such that the connector module 3 becomes a power bank.

The edge of the adaptor body 1 may also be formed with a groove 12. The groove 12 receives a connection cable 5 such that the connection cable 5 wounds around the adaptor body 1. The position of the groove 12 is not limited to the instant embodiment, and the groove 12 may be at any position of the edge of the adaptor body 1, for example, left side, right side, top side, or bottom side.

The connection cable 5 has an internal conductive body and an insulation coat; however, the configuration and structure of the connection cable 5 is not limited. The connection cable 5 may be any types of cable or wire. One end of the connection cable 5 has a connection head, while the other end of the connection cable 5 has a second connector 52. The connection head 51 and the second connector 52 may be USB connector, IEEE1394 connector, HDMI connector, AV terminal, DC terminal or the like. The connection head 51 and the second connector 52 may be female or male form and the instant disclosure is not limited thereto.

One end of the connection cable 5 can be electrically connected to the connector module 3 through the connection head 51. Of course, one end of the connection cable 5 may be electrically connected to the connector module 3 through different configurations. The connection cable 5 selectively wounds about the edge of the adaptor body 1. That is to say the connection cable 5 can be received by the groove 12 of the adaptor body 1, such that when the connection cable 5 is not in sue, it is securely stored. The connection cable 5 may be pulled out from the groove 12 for use.

The edge of the adaptor body 1 may also have a mating slot 13 and a receiving slot 14. The mating slot 13 and the receiving slot 14 are respectively communicable to two ends of the groove 12. The mating slot 13 and the receiving slot 14 are for receiving the connection head 51 and the second connector 52 via the groove 12.

The edge of the connector module 3 may be formed with a connection point 34 corresponding to the mating slot 13. The connection point 34 may be a USB connector, IEEE1934 connector, HEMI connector, AV terminal, DC terminal or the like. The connection point 34 is disposed at one side of the connector module 3 adjacent to the mating slot 13, such that when the connection head 51 plugs into the mating slot 13, it also mates with the connection point 34. Consequently, the connection cable 5 and the second connector 52 are electrically connected to the connector module 3 through the connection head 51 and the connection point 34. In addition, when the connection head 51 plugs into the mating slot 13 and the connection point 34 simultaneously, the engagement is more secure, like a double lock. In general, the connection head 51 firmly grabs the adaptor body 1 and the connector module 3.

The instant embodiment further includes a receiving box 6 disposed on the adaptor body 1. The front of the receiving box 6 is formed with an opening 61. The receiving box 6 has a load plate 7 movably disposed within. The load plate 7 can slide forward or backward relative to the receiving box 6. The load plate 7 selectively extends from the opening 61 of the receiving box 6. In other words, when the load plate 7 slides forward, it reaches out of the receiving box 6 through the opening 61 so as to carry an electronic product.

Figure 3:
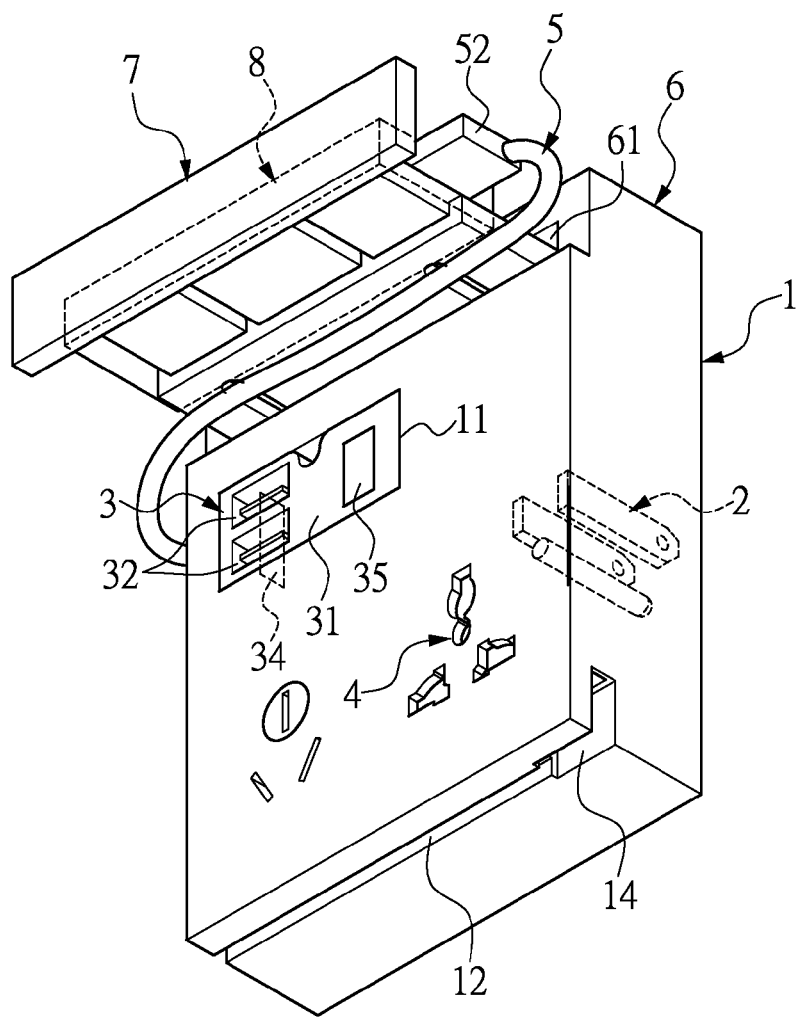
FIG. 3 is a schematic view of a wall adaptor in use in accordance with a first embodiment of the instant disclosure.

The wall adaptor can be hung on the wall by the terminal unit 2, plugging into corresponding wall receptacle. The wall adaptor is then conducted to the power and signal route. As shown in FIG. 3, a user can electrically connects an electronic product 8 (for example, mobile phone) to the first connector 32, the second connector 52 or the receptacle unit 4. In the instant embodiment, the electronic product 8 is electrically connected to the second connector 52. The user may pull out the load plate 7 from the receiving box 6 and lay the electronic product 8 thereon. In this regard, when the electronic product 8 undergoes electricity connection, charging and Internet communication, it is safely placed.

The adaptor body 1 of the instant embodiment may further combine with the connection cable 5 and the second connector 52, and the connection cable 5 and the second connector 52 are movably disposed on the adaptor body 1. When a user needs to use the connection cable 5 and the second connector 52, the connection cable 5 and the second connector 52 are immediately available by pulling out of the groove 12 and the receiving slot 14 of the adaptor body 1. The connection cable 5 and the second connector 52 can be easily located without time consuming searching for the connection cable 5 and the second connector 52. The usage of the connection cable 5 and the second connector 52 is relatively convenient. When the connection cable 5 and the second connector 52 are not in use, the connection cable 5 and the second connector 52 do not need to be unplugged. Instead, the connection cable 5 and the second connector 52 are stored in the groove 12 and the receiving slot 14 of the adaptor body 1. Therefore, the connection cable 5 and the connector 52 are less likely to be missing, easier to retrieve, neatly organized and minimizing interference, such that the user can easily handle the wall adaptor.

In another embodiment of the instant disclosure, the wall adaptor may further include a connector module (not shown). The configuration of the connector module is identical to the connector module 3 described above, and the connector module is secured on the adaptor body 1.

Figure 4:
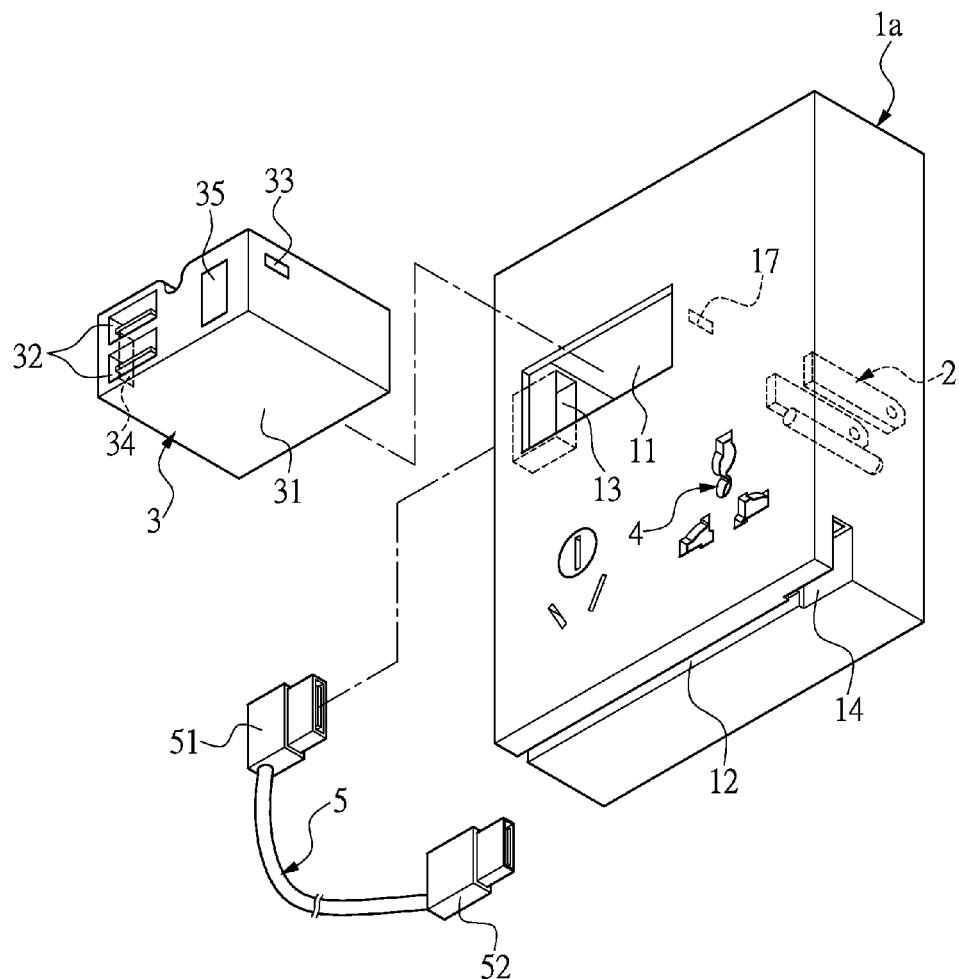
FIG. 4 is a perspective exploded view of a wall adaptor in accordance with a second embodiment of the instant disclosure.

[Second Embodiment]
Please refer to FIG. 4. In the instant embodiment, the abovementioned receiving box 6 and the load plate 7 are omitted, such that the overall wall adaptor configuration is simplified.

Figure 5:
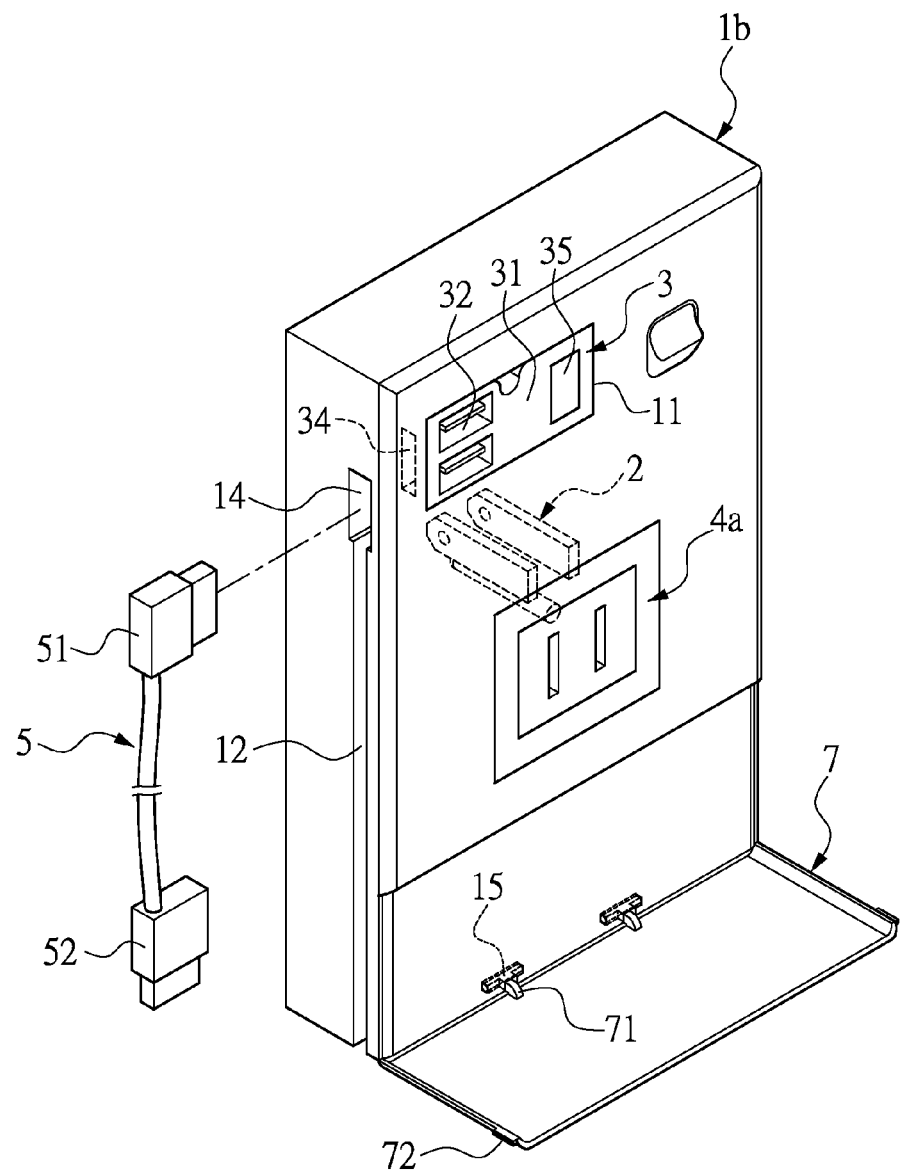
FIG. 5 is a perspective view of a wall adaptor in accordance with a third embodiment of the instant disclosure.

[Third Embodiment]
Please refer to FIG. 5. In the instant embodiment, the adaptor body 1b is pivotally connected to a load plate 7. In other words, the adaptor body 1b has a first pivot portion 15, and one side of the load plate 7 has a second pivot portion 71. The first pivot portion 15 and the second pivot portion 71 are corresponding pivot hole and pivot shaft. The first pivot portion 15 and the second pivot portion 71 are pivotally connected to each other, such that the load plate 7 may flap in relation to the adaptor body 1b. However, the connection method between the load plate 7 and the adaptor body 1b is not limited thereto, any shaft, pivot or chain being acceptable. The load plate 7 may flap downward to a horizontal position for receiving the electronic product, whereas the load plate 7 may flap upward so as to be stacked on the front of the adaptor body 1b. The edge of the load plate may also have a latch 72, such that when the load plate 7 flaps upward, the latch engages with the adaptor body 1b.

Figure 6:
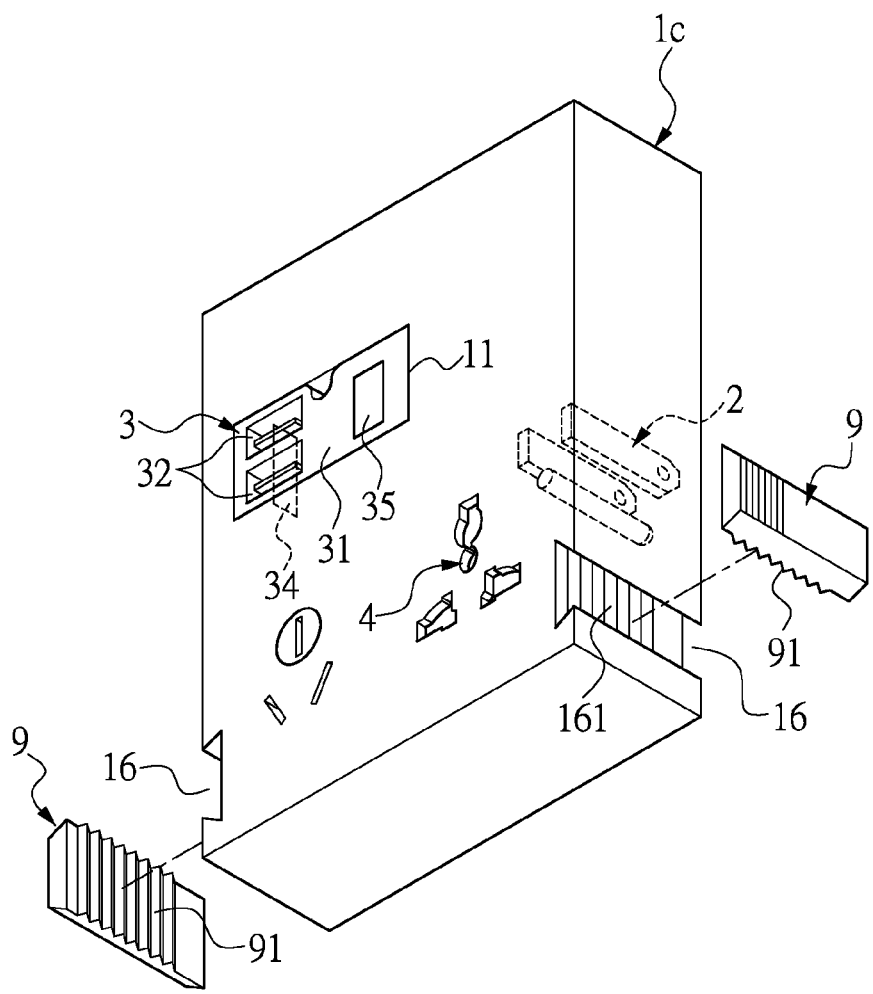
FIG. 6 is a perspective view of a wall adaptor in accordance with a fourth embodiment of the instant disclosure.

[Fourth Embodiment]
Please refer to FIG. 6. In the instant embodiment, the adaptor body 1c has a support frame 9 adjustably disposed on the adaptor body 1c. In the instant embodiment, the number of support frame 9 in the instant embodiment is two. The two support frames 9 are slidably disposed along two sides of the adaptor body 1c. The adaptor body 1c has two sliding slots 16 at two sides. The sliding slots 16 and the support frames 9 collectively shape as a swallow tail or "T" shaped. The two support frames 9 are slidably disposed in the two sliding slots 16, such that the two support frames 9 can slide and be adjusted. The movement of the support frames 9 allows the two support frames 9 being selectively projected out of one side (rear side) of the adaptor body 1c where the terminal unit 2 is. When the wall adaptor plugs into a wall receptacle through the terminal unit 2, the two support frames 9 can be adjusted, such that the two support frames 9 abuts the wall receptacle or the wall and the wall adaptor is secured thereby without any chance of unsteadiness. The inner wall of the sliding slots 16 may have a tooth-shaped first toothed portion 161. One side of the support frame 9 may also have a tooth-shaped second toothed portion 91. When the support frame 9 is adjusted to the correct position, the first toothed portion 161 and the second toothed portion 91 are engaged through biting.

Figure 7:
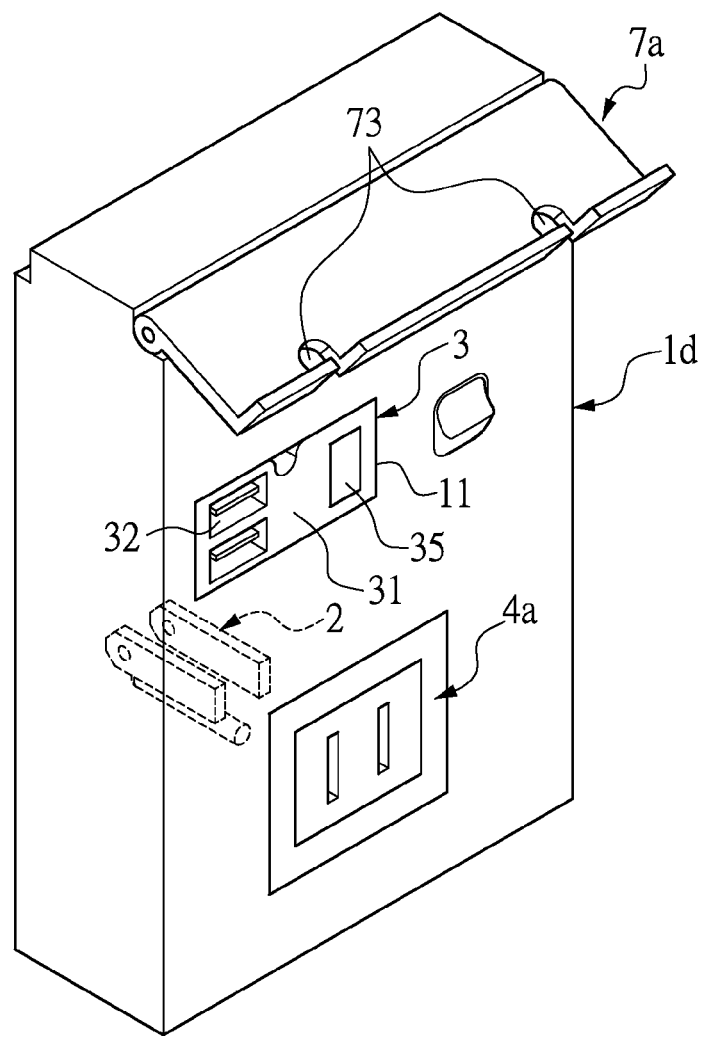
FIG. 7 is a perspective view of a wall adaptor in accordance with a fifth embodiment of the instant disclosure.

[Fifth Embodiment]
Please refer to FIG. 7. In the instant embodiment, the adaptor body 1d is pivotally connected to a load plate 7a. The load plate 7a is pivotally connected to the top side of the adaptor body 1d, such that the load plate 7a can flip in relation to the adaptor body 1d. The load plate 7a may flip downward to a horizontal position for the placement of electronic products. The load plate 7a may also flip upward to stack on the top side of the adaptor body 1d. The edge of the load plate 7a is formed with a plurality of notches 73. The notches 73 allow the cable, connector or the like of the electronic product to be hung. In the instant embodiment, the connection cable 5, connection head 51 and the second connector 52 are omitted, and the groove 12, mating slot 13 and the receiving slot 14 are omitted.

Figure 8:
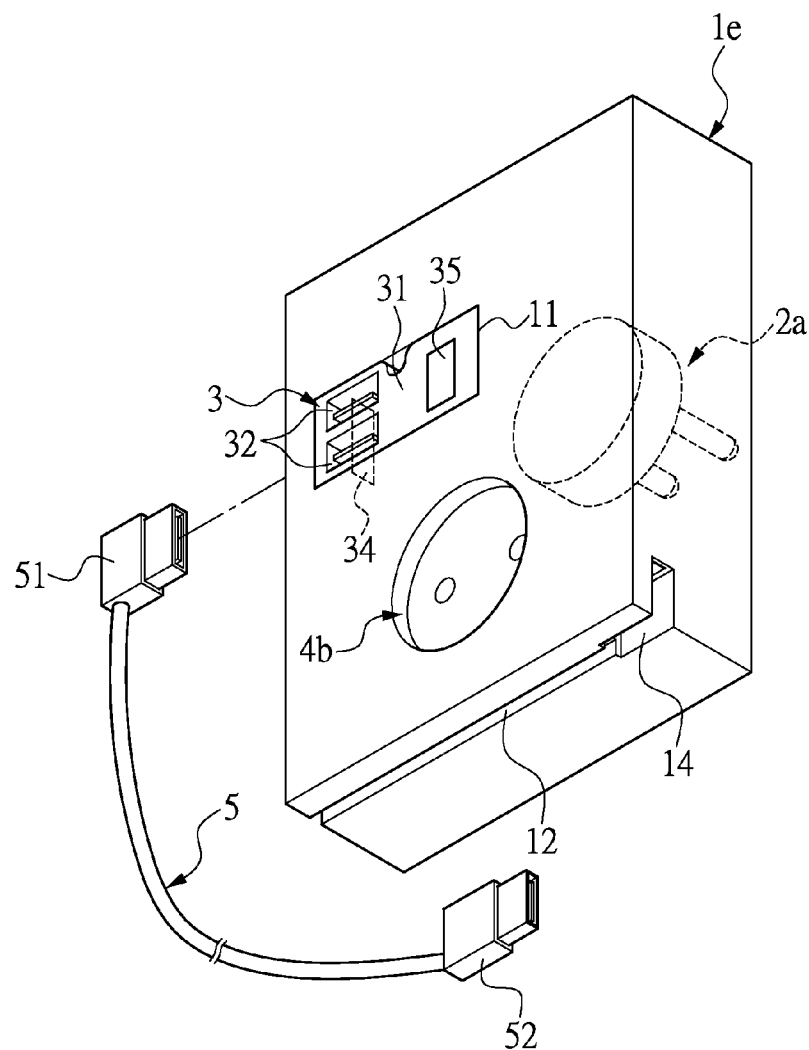
FIG. 8 is a perspective view of a wall adaptor in accordance with a sixth embodiment of the instant disclosure.
Figure 9:
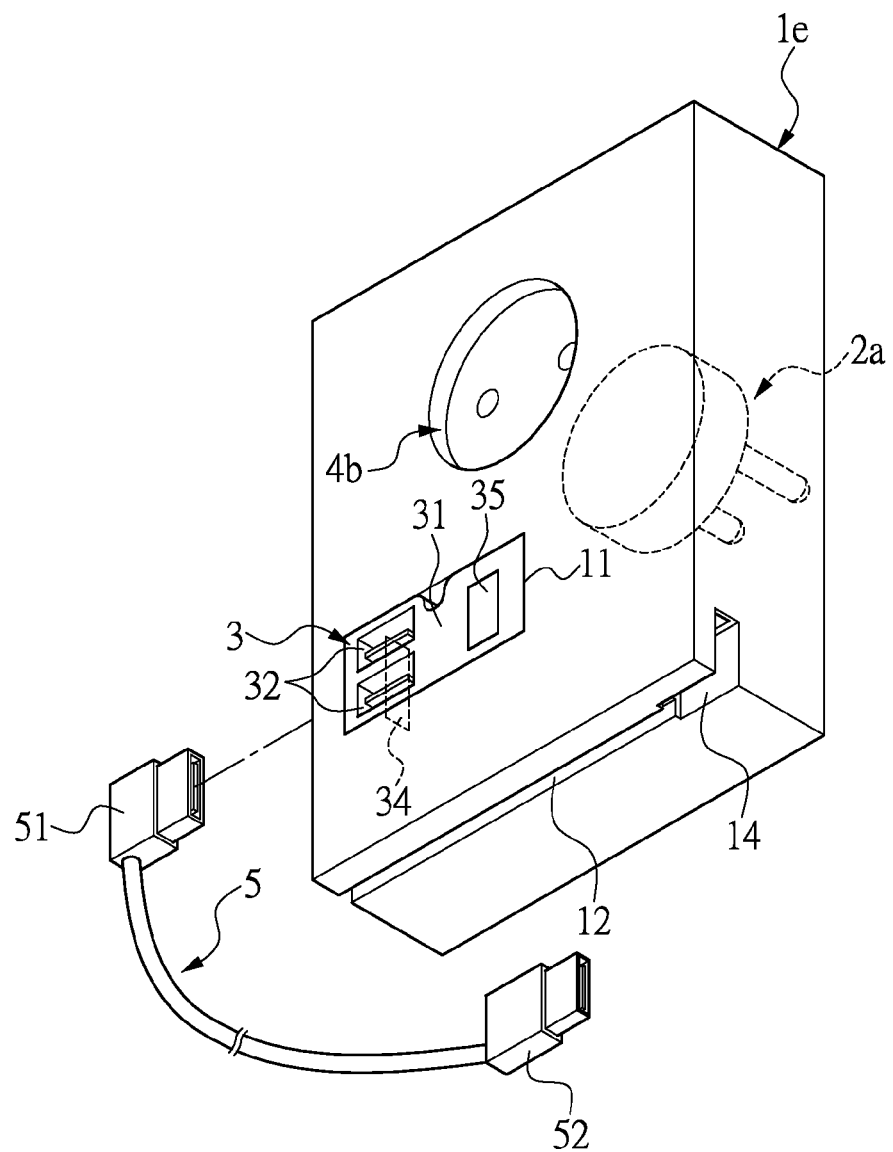
FIG. 9 is a perspective view of a wall adaptor in accordance with a seventh embodiment of the instant disclosure.

[Sixth and Seventh Embodiment]
Please refer to FIGS. 8 and 9. In the instant embodiment, the terminal unit 2a and the receptacle unit 4b satisfy the European standard (e.g., German standard). The receptacle unit 4b is disposed on the adaptor body 1e. The receptacle unit 4b may be positioned under the connector module 3 (as shown in FIG. 8) or above the connector module 3 (as shown in FIG. 9).

[Eighth Embodiment]

Figure 10:
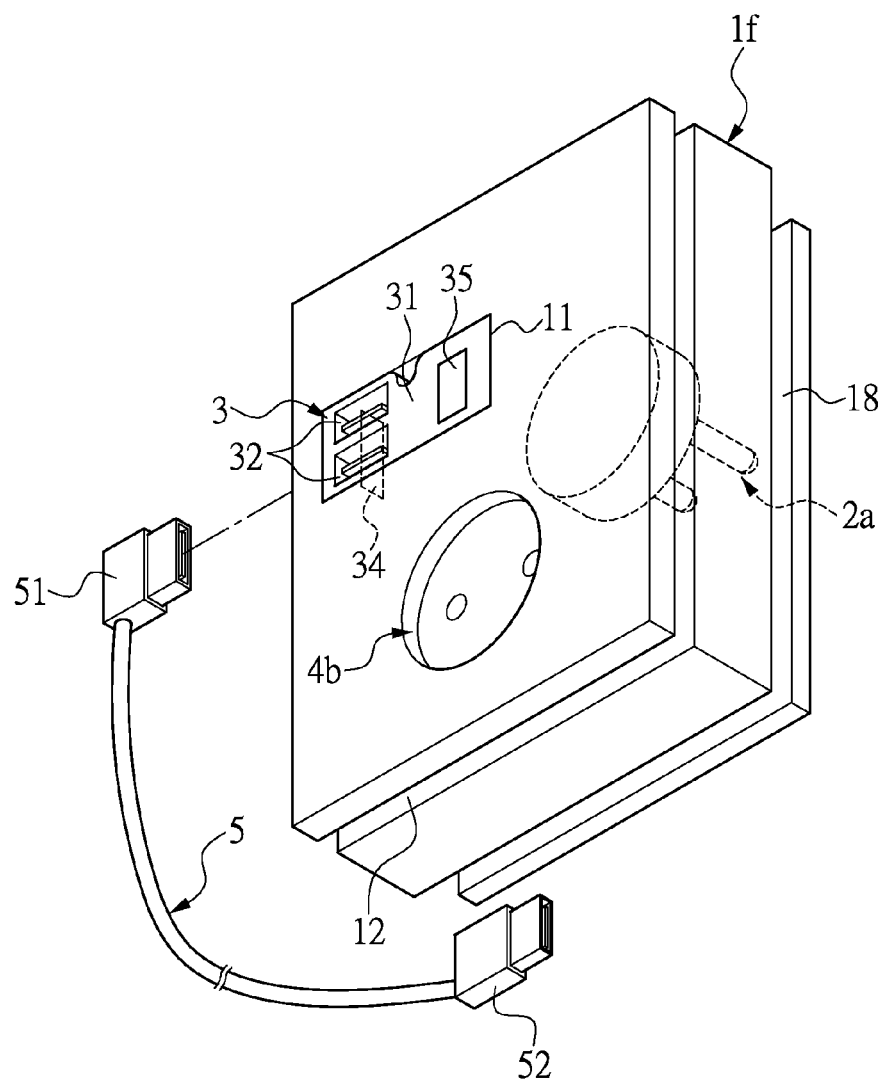
FIG. 10 is a perspective view of a wall adaptor in accordance with an eighth embodiment of the instant disclosure.

Please refer to FIG. 10. In the instant embodiment, the rear half of the adaptor body 1f is formed with a wiring layer 18, such that the connection cable 5 can wound about the groove 12 and the edge of the wiring layer 18.

[Ninth Embodiment]

Figure 11:
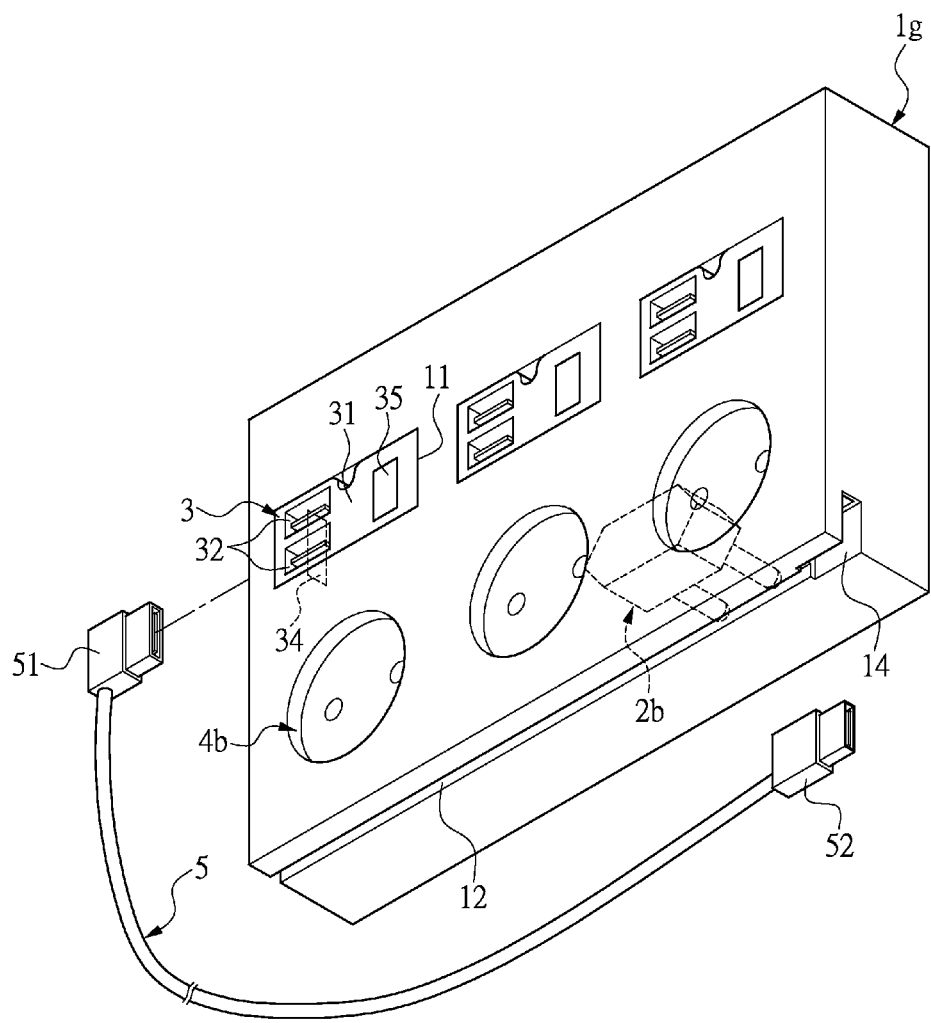
FIG. 11 is a perspective view of a wall adaptor in accordance with a ninth embodiment of the instant disclosure.

Please refer to FIG. 11. In the instant embodiment, the terminal unit 2b and the receptacle unit 4b satisfy European standard (e.g., German standard) and include a plurality of connector modules 3 and a plurality of receptacle units 4b. The connector modules 3 are detachably disposed on the adaptor body 1g, and the receptacle units 4b are disposed on the adaptor body 1g.

[Tenth Embodiment]

Figure 12:
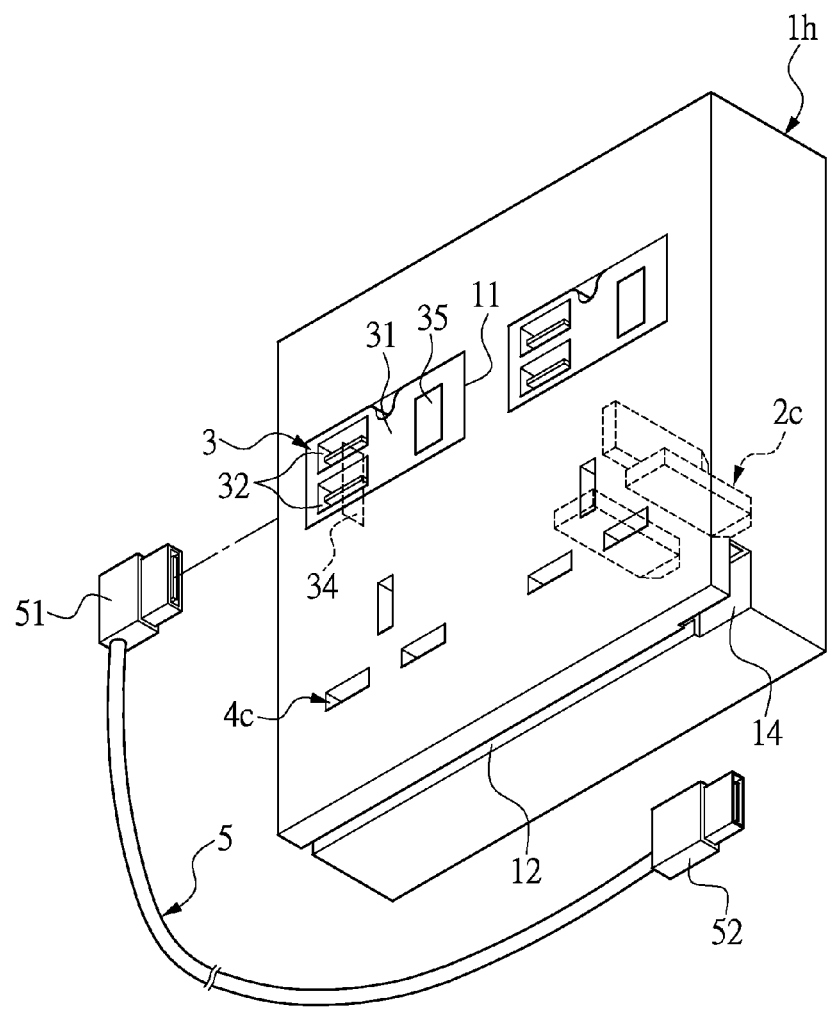
FIG. 12 is a perspective view of a wall adaptor in accordance with a tenth embodiment of the instant disclosure.

Please refer to FIG. 12. In the instant embodiment, the receptacle unit 4c satisfies British standard.

[Eleventh and Twelfth Embodiment]

Figure 13:
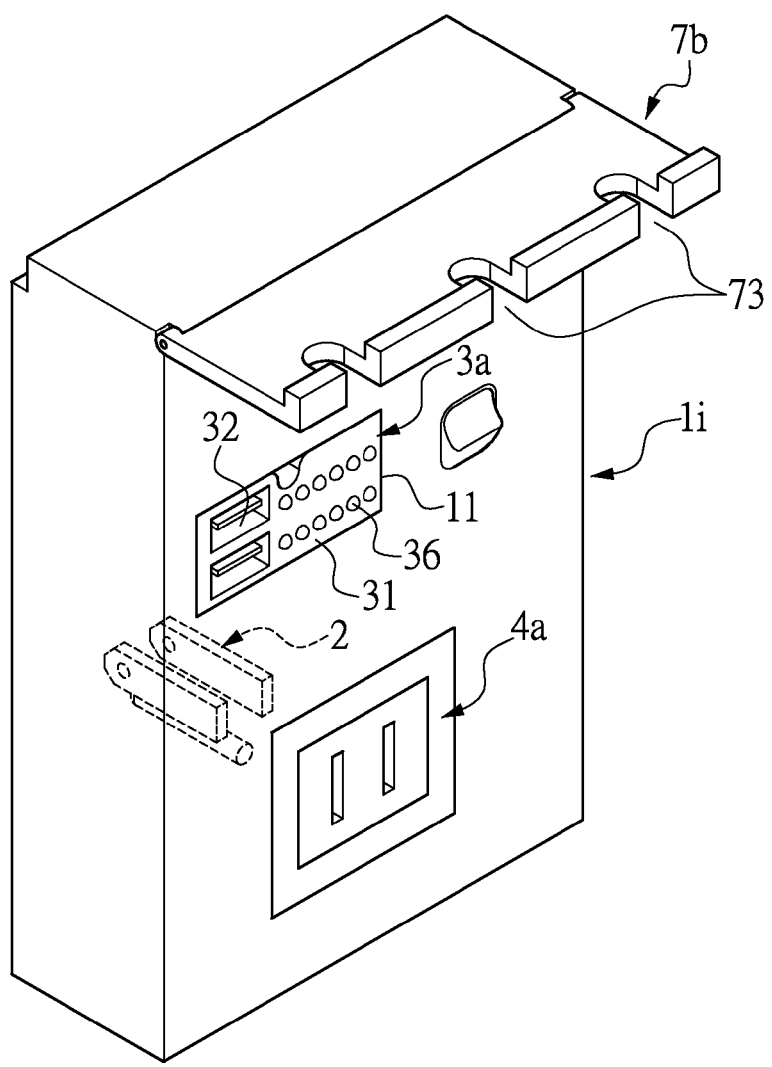
FIG. 13 is a perspective view of a wall adaptor in accordance with a eleventh embodiment of the instant disclosure.
Figure 14:
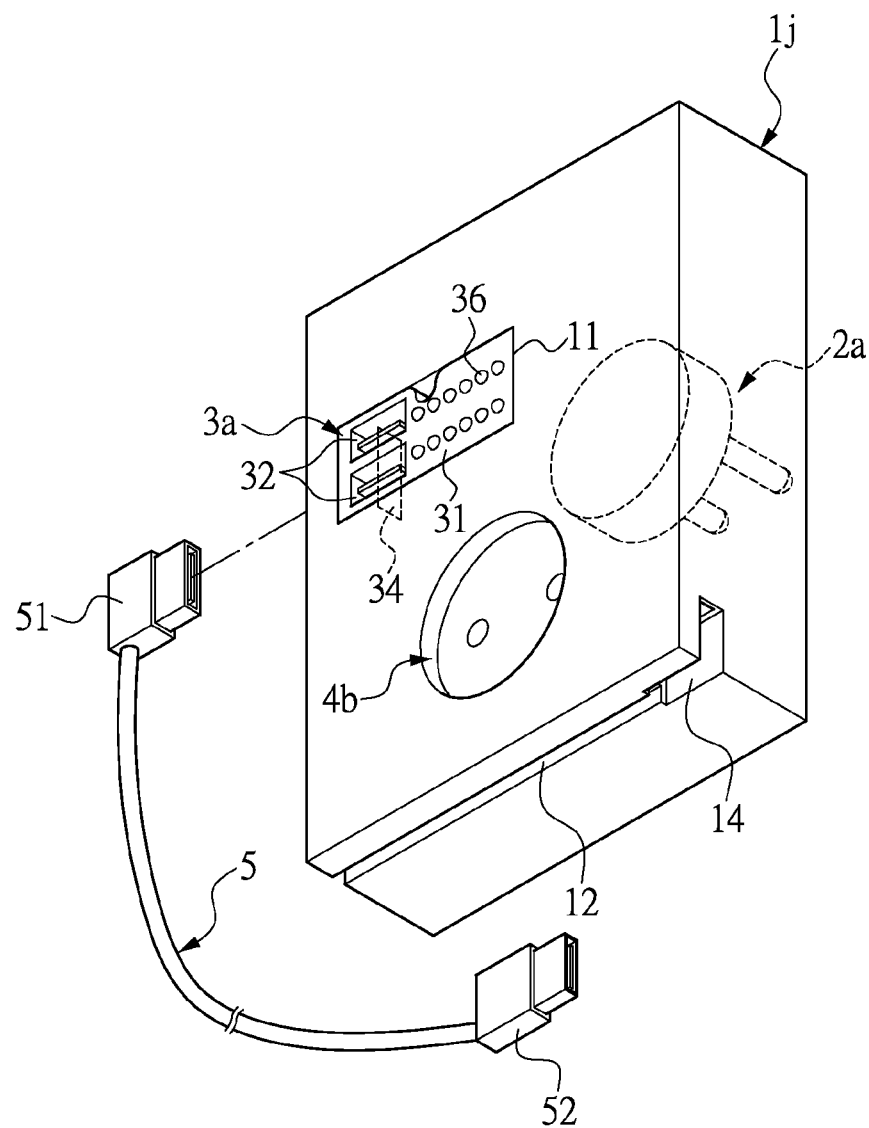
FIG. 14 is a perspective view of a wall adaptor in accordance with a twelfth embodiment of the instant disclosure.

Please refer to FIGS. 13 and 14. In the instant embodiment, the connector module 3a has a display device 36. The display device 36 may be a plurality of light emitted diodes or a liquid crystal display. In the instant embodiment, the display device 36 is a plurality of light emitting diodes. The display device 36 is electronically connected to the connector module 3a. For example, the display device 36 may be electrically connected to the first connector 32. When the electronic product is electrically connected to the first connector 32, the display device shows the volume of current transmitting to the electronic product. For example, when the number of illuminated light emitted diodes is more, it is equivalent to greater current stream. The display device 36 can show current volume and voltage volume as well.

[Thirteenth Embodiment]

Figure 15:
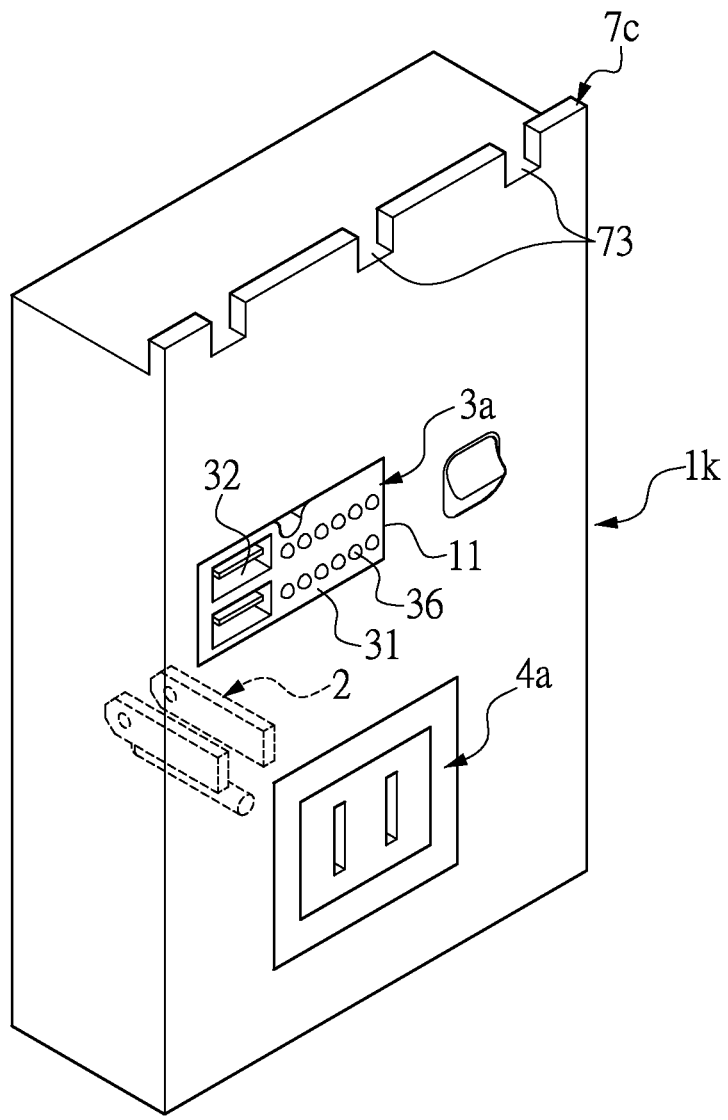
FIG. 15 is a perspective view of a wall adaptor in accordance with a thirteenth embodiment of the instant disclosure.

Please refer to FIG. 15. In the instant embodiment, the adaptor body 1k has a load plate 7c. The load plate 7c is disposed on the top side of the adaptor body 1k. The load plate 7c may serve as a placement of the electronic product. The edge of the load plate 7c may be formed with a notch 73 where the cable and connector of the electronic product hang.

[Fourteenth Embodiment]

Figure 16:
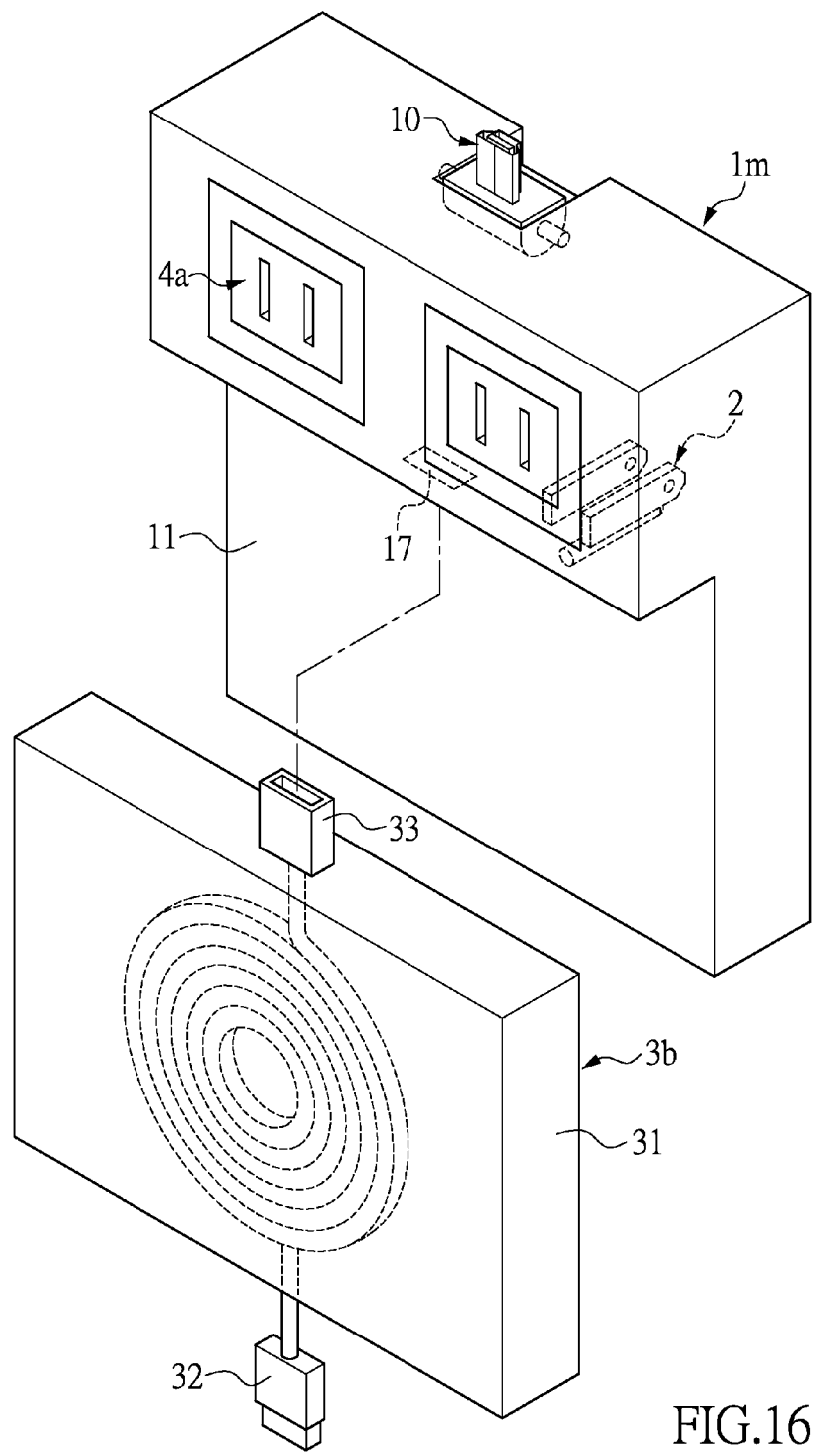
FIG. 16 is a perspective view of a wall adaptor in accordance with a fourteenth embodiment of the instant disclosure.

Please refer to FIG. 16. In the instant embodiment, a portion of the adaptor body 1m is depressed to form an accommodating slot 11. The adaptor body 1m may have a third connector 10 fixedly or rotatably secured on the adaptor body 1m. The third connector 10 may be electrically connected to the adaptor body 1m and the terminal unit 2. The third connector 10 may be an output or an input. The terminal unit 2 is disposed on the adaptor body 1m, and the terminal unit 2 is in pin arrangement. The connector module 3b is a cable reel. The connector module 3b is detachably disposed in the accommodating slot 11 of the adaptor body 1m. The connector module 3b has a module body 31 and at least one first connector 32 disposed on the module body 31. The connector module 3b and the adaptor body 1m have corresponding electrical contacts 17, 33 respectively. In the instant embodiment, the electrical contacts 17, 33 are corresponding connectors, and they contact each other to establish electrical connection.

[Fifteenth Embodiment]

Figure 17:
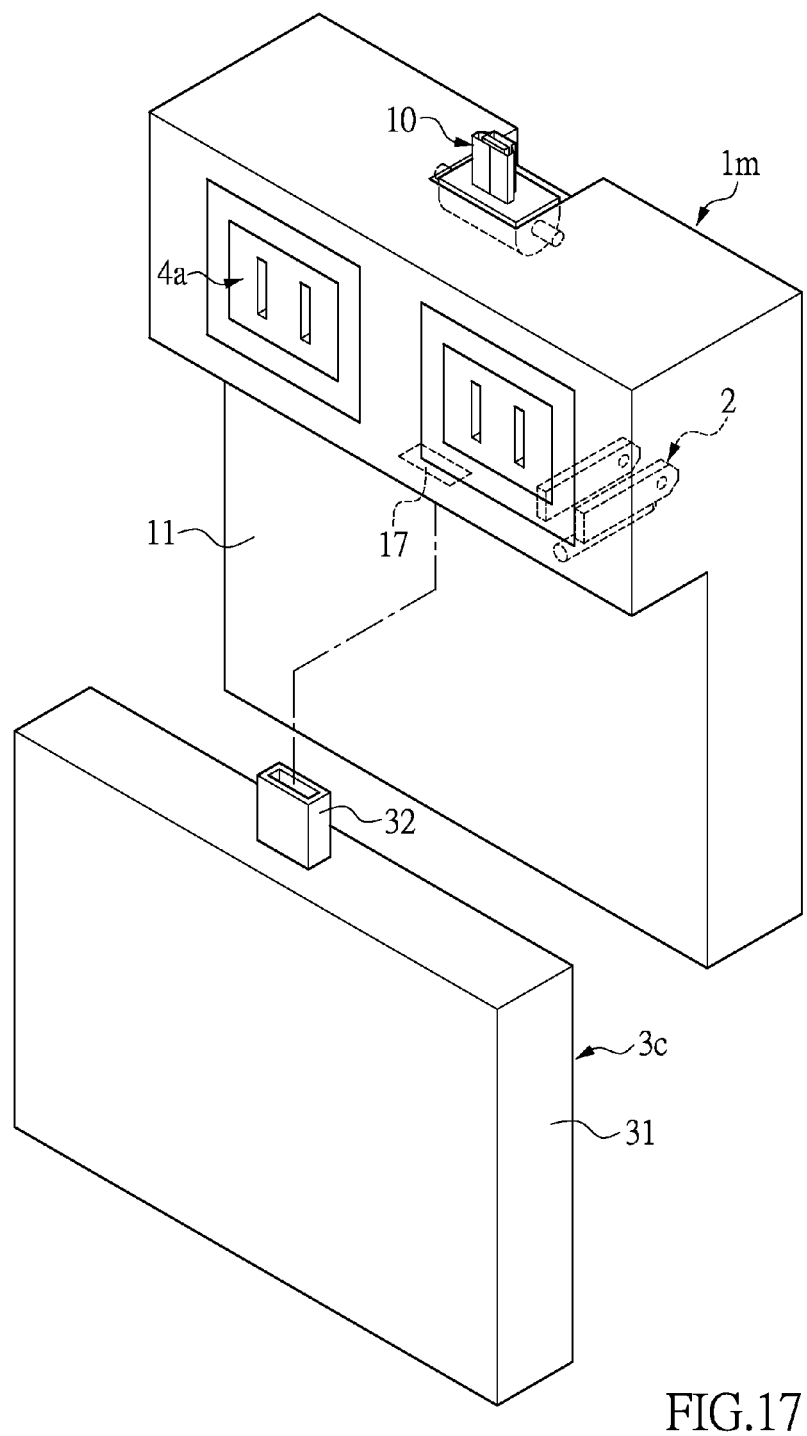
FIG. 17 is a perspective view of a wall adaptor in accordance with a fifteenth embodiment of the instant disclosure.

Please refer to FIG. 17. In the instant embodiment, the connector module 3c is a battery module. The connector module 3c is detachably disposed in the accommodating slot 11 of the adaptor body 1m. The connector module 3c has a module body 31 and at least one first connector 32 disposed on the module body 31. The first connector 32 may be an output and an input. The first connector 32 may act as an electrical contact. In other words, the first connector 32 of the connector module 3c may be electrically connected to the electrical contacts 17 of the adaptor body 1m.

[Sixteenth Embodiment]

Figure 18:
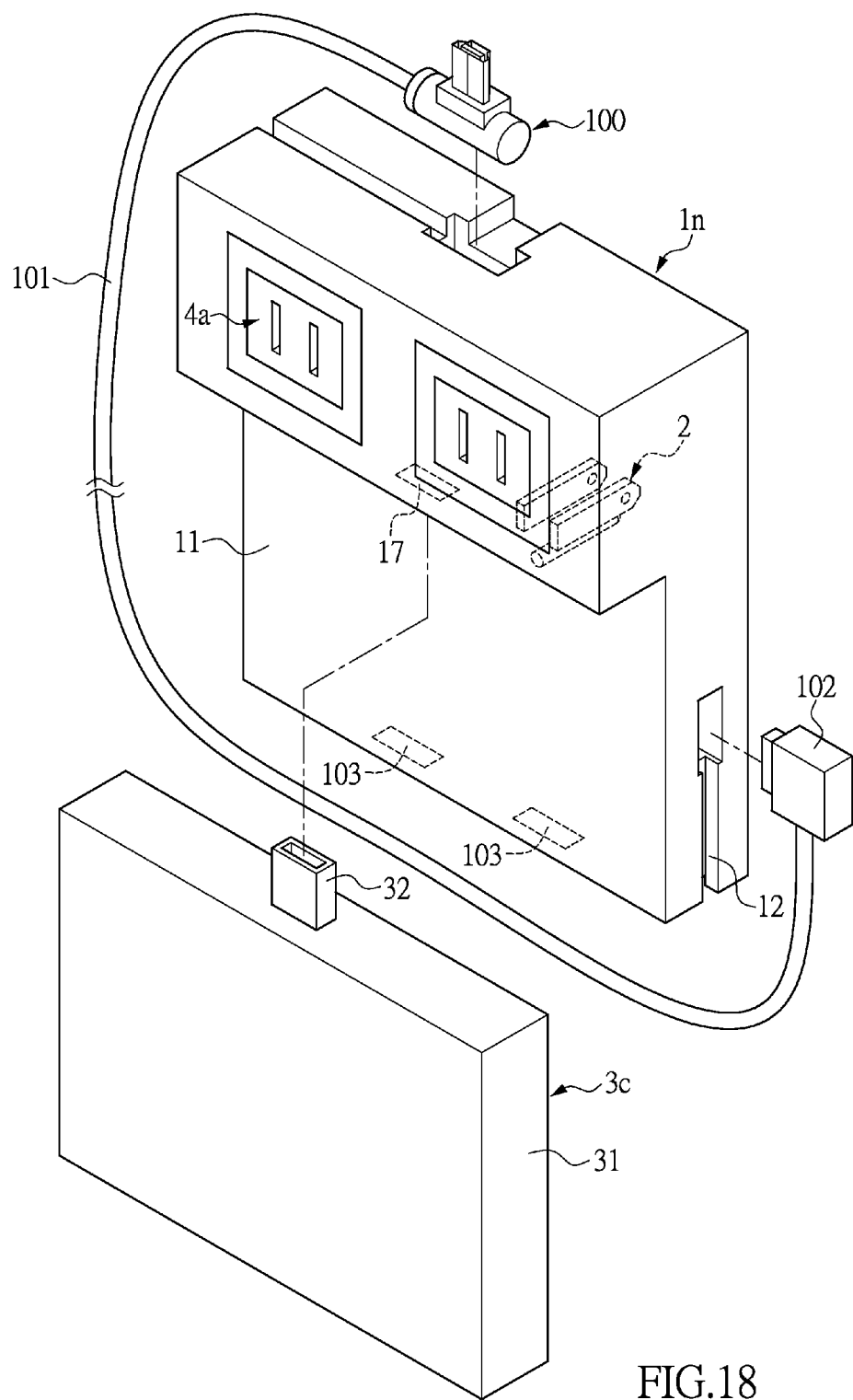
FIG. 18 is a perspective view of a wall adaptor in accordance with a sixteenth embodiment of the instant disclosure.

Please refer to FIG. 18. In the instant embodiment, a fourth connector 100 is detachably disposed on the adaptor body 1n. The fourth connector 100 may be erected or lying down on the adaptor body 1n. When the fourth connector 100 is erected on the adaptor body 1n, the fourth connector 100 can be electrically connected to the electronic product (e.g., mobile phone). The fourth connector 100 connects a fifth connector 102 through a cable 101. One end of the cable 101 is electrically connected to the adaptor body 1n through the fifth connector 102. The cable 101 may selectively wound about the edge of the adaptor body 1n. In other words, the connection cable 5 may wound about within the groove 12 of the adaptor body 1n. The side of the adaptor body 1n may further include a sixth connector 103. The sixth connector 103 is electrically connected to the adaptor body 1n. The sixth connector 103 may be an input and output.

[Seventeenth Embodiment]

Figure 19:
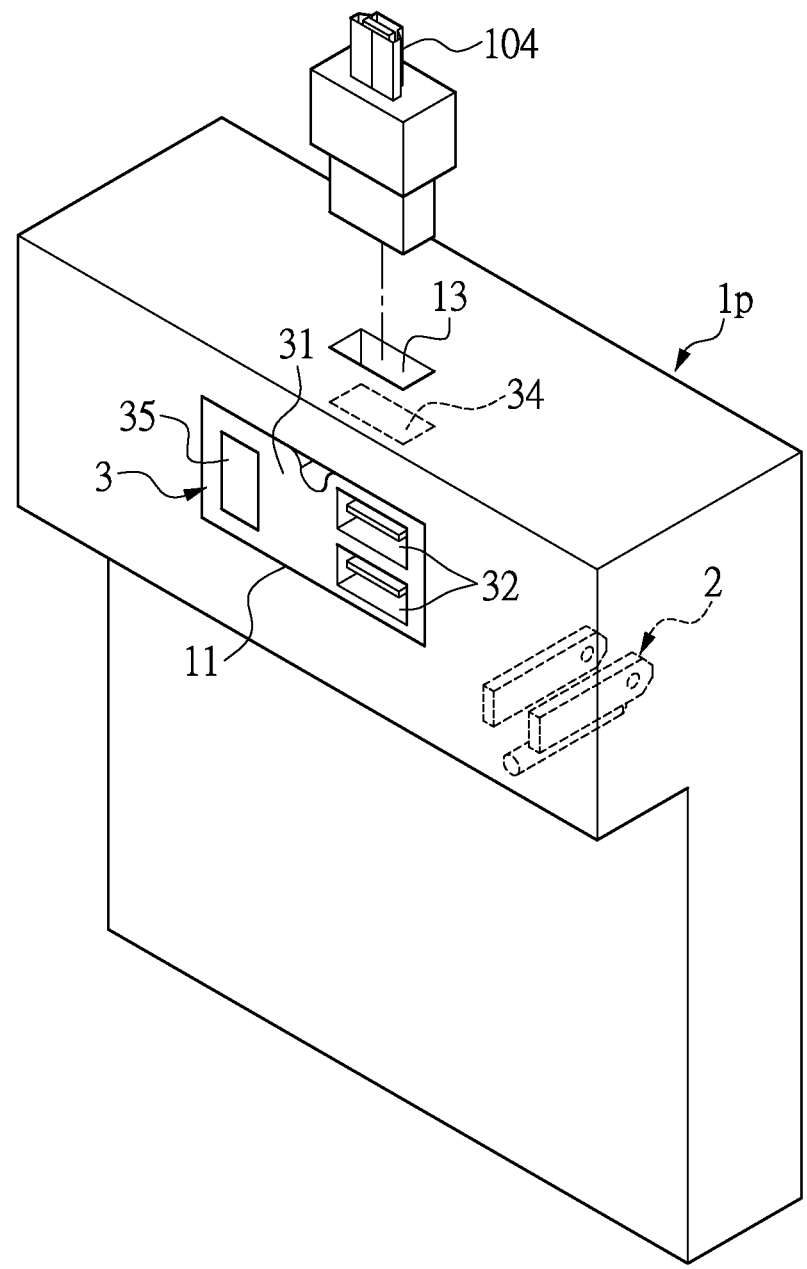
FIG. 19 is a perspective view of a wall adaptor in accordance with a seventeenth embodiment of the instant disclosure.

Please refer to FIG. 19. In the instant embodiment, the side of the adaptor body 1p is formed with a mating slot 13. The mating slot 13 is positioned at the top side of the adaptor body 1p. The edge of the connector module 3 is formed with a connection point 34 corresponding to the mating slot 13. The connection point 34 is disposed at a side (top side) of the connector module 3 adjacent to the mating slot 13. The end of an adaptor 104 plugs into the mating slot 13 and the connection point 34, such that the adaptor 104 is firmly secured to the adaptor body 1p (top side). In this way, the other end of the adaptor 104 can be connected to the electronic product, such that the electronic product can connect to power, charge and connect to the electronic product.

[Eighteenth Embodiment]

Figure 20:
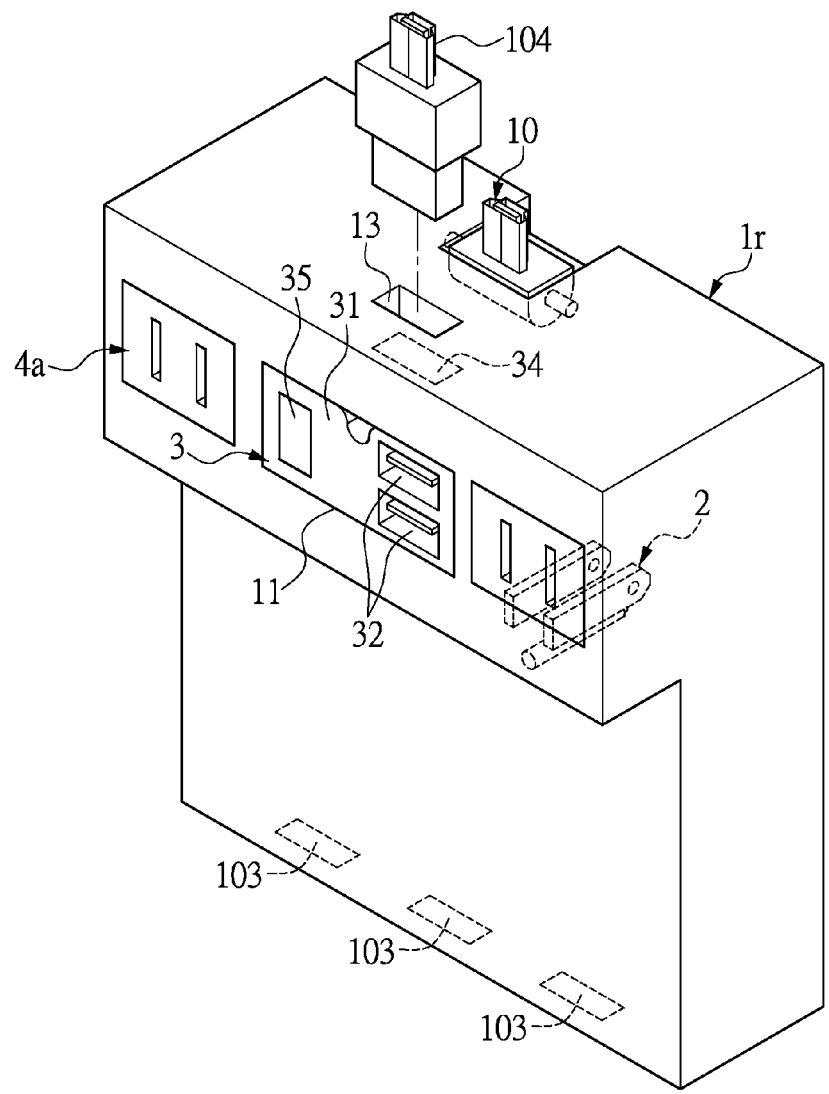
FIG. 20 is a perspective view of a wall adaptor in accordance with an eighteenth embodiment of the instant disclosure.

Please refer to FIG. 20. In the instant embodiment, the side of the adaptor body 1r is formed with a mating slot 13. The side of the connector module 3 is formed with a connection point 34 which allows one end of an adaptor 104 to plug into the mating slot 113 and the connection point 34, such that the adaptor 104 can be engaged to the adaptor body 1r. The other end of the adaptor 104 is connected to the electronic product so as to undergo power connection, charging, Internet transmission. Furthermore, the adaptor body 1r may also include a rotatable third connector 10. The third connector 10 can be electrically connected to the adaptor body 1r and the terminal unit 2. The third connector 10 may be an input and output. The side of the adaptor body 1r further includes a plurality of sixth connectors 103. The sixth connectors 103 may be different types of connector and electrically connected to the adaptor body 1r. The sixth connector may be an input and output.

The connector module of the instant disclosure can be detachably disposed on the adaptor body, such that different connector modules can be used with greater adaptability, more convenience. In addition, the adaptor body does not need to be changed so as to reduce the cost and relieve the burden of buying new modules from the user.

The instant disclosure also has the load plate which can carry the electronic product. Because the load plate carries the electronic products which connects to power or Internet via the wall adaptor, the electronic product is then protected, and the normal operation is maintained. The load plate may also be used along with the connection cable and the second connector to provide preferable effect.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A wall adaptor comprising:
an adaptor body formed with an accommodating slot;
a terminal unit disposed on the adaptor body and having a pin arrangement; and
a connector module detachably disposed in the accommodating slot of the adaptor body, wherein the connector module has a module body and at least a first connector disposed on the adaptor body, the connector module and the adaptor body are in electrical communication through electrical contacts, and the at least one first connector is exposed on the adaptor body;
wherein the adaptor body has an adjustable support frame;
wherein the adaptor body is formed with a sliding slot, the support frame is slidably disposed in the sliding slot and selectively projects out of one side of the adaptor body arranged proximate to the terminal unit;
wherein the sliding slot has an inner wall formed with a tooth-shaped first toothed portion, one side of the support frame has a tooth-shaped second toothed portion, the first and second toothed portions conformingly mate each other.

2. The wall adaptor according to claim 1, wherein a side of the adaptor body is formed with a groove for receiving a connection cable, one end of the connection cable has a connection head, the other end of the connection cable is connected to a second connector, another side of the adaptor body is formed with a mating slot communicable to one end of the groove, a side of the connector module is formed with a connection point, and the connection head mates with the connection point and within the mating slot.

3. The wall adaptor according to claim 2, wherein the side of the adaptor body is formed with a receiving slot communicable to the other end of the groove, and the second connector is received by the receiving slot.

4. The wall adaptor according to claim 1, wherein the adaptor body has a receiving box disposed thereon, the receiving box is formed with an opening at a front side, the receiving box has a load plate movably disposed therein, and the load plate selectively extends out of the opening of the receiving box.

5. The wall adaptor according to claim 1, wherein the adaptor body is pivotally connected to a load plate, the load plate is flappable to a horizontal or vertical position relative to the adaptor body or stackable on the adaptor body.

6. The wall adaptor according to claim 1, wherein the module body has an electronic device disposed thereon, the electronic device is a converter, night lamp, wireless charger, emergency light, wireless controller, wireless access point, wireless module, timer, ground fault circuit interrupters (GFCI), sensor, moving detector, cable receiver or battery.

7. The wall adaptor according to claim 1, wherein the adaptor body is formed with a wiring layer, the wiring layer has an edge connected to a connection cable, one end of the connection cable is connected to a connection head, the other end of the connection cable is connected to a second connector, one side of the adaptor body is formed with a mating slot, the connector module has a side formed with a connection point, the connection head mates with the connection point and within the mating slot.

8. The wall adaptor according to claim 1, wherein the connector module has a display device disposed thereon for showing electrical current or voltage, the display module has a plurality of light-emitting diodes or a liquid crystal display.

9. The wall adaptor according to claim 1, wherein another connector module is disposed on the adaptor body.

10. The wall adaptor according to claim 1, wherein the adaptor body has a load plate.

11. A wall adaptor comprising:
an adaptor body formed with an accommodating slot;
a terminal unit disposed on the adaptor body; and
a connector module detachably disposed in the accommodating slot of the adaptor body, wherein the connector module has a module body and at least a first connector disposed on the adaptor body, the connector module and the adaptor body are in electrical communication through electrical contacts;
wherein the adaptor body has an adjustable support frame;
wherein the adaptor body is formed with a sliding slot, the support frame is slidably disposed in the sliding slot and selectively projects out of one side of the adaptor body proximate to the terminal unit;
wherein the sliding slot has an inner wall formed with a tooth-shaped first toothed portion, one side of the support frame has a tooth-shaped second toothed portion, the first and second toothed portions conformingly mate each other.

12. The wall adaptor according to claim 11, wherein a side of the adaptor body is formed with an accommodating slot conforming to the connector module, and the connector module is selectively received by the accommodating slot.

13. The wall adaptor according to claim 11, wherein the adaptor body has a side formed with a groove for receiving a connection cable, one end of the connection cable has a connection head, the other end of the connection cable is connected to a second connector, another side of the adaptor body is formed with a mating slot communicable to one end of the groove, the connector module has a side formed with a connection point, and the connection head mates with the mating slot and within the connection point.

14. The wall adaptor according to claim 13, wherein the side of the adaptor body is formed with a receiving slot communicable to the other end of the groove, and the second connector is received by the receiving slot.

15. The wall adaptor according to claim 11, wherein the adaptor body has a receiving box disposed thereon, the receiving box is formed with an opening at a front side, the receiving box has a load plate movably disposed therein, and the load plate selectively extends out of the opening of the receiving box.

16. The wall adaptor according to claim 11, wherein the adaptor body is pivotally connected to a load plate, the load plate is flappable to a horizontal or vertical position relative to the adaptor body or stackable on the adaptor body.

17. The wall adaptor according to claim 11, wherein the module body has an electronic device disposed thereon, the electronic device is a converter, night lamp, wireless charger, emergency light, wireless controller, wireless access point, wireless module, timer, ground fault circuit interrupters (GFCI), moving detector, cable receiver or battery.

18. The wall adaptor according to claim 11, wherein the adaptor body is formed with a wiring layer, the wiring layer has an edge connected to a connection cable, one end of the connection cable is connected to a connection head, the other end of the connection cable is connected to a second connector, one side of the connector is formed with a mating slot, the connector module has a side formed with a connection point, the connection head mates with the connection point and within the mating slot.

19. The wall adaptor according to claim 11, wherein the connector module has a display device disposed thereon for showing electrical current or voltage, the display module has a plurality of light-emitting diodes or a liquid crystal display.

20. The wall adaptor according to claim 11, wherein another connector module is disposed on the adaptor body.

21. The wall adaptor according to claim 11, wherein the adaptor body has a load plate.

22. The wall adaptor according to claim 11, wherein the adaptor body has a side formed with a mating slot, the adaptor body has a side formed with a connection point, one end of a connection head mates with the connection point and within the mating slot.

\* \* \* \* \*